United States Patent [19]

Russell

[11] Patent Number: 5,128,941
[45] Date of Patent: Jul. 7, 1992

[54] METHOD OF ORGANIZING A MEMORY FOR FAULT TOLERANCE

[75] Inventor: Robert J. Russell, South Boston, Mass.

[73] Assignee: Bull HN Information Systems Inc., Billerica, Mass.

[21] Appl. No.: 453,644

[22] Filed: Dec. 20, 1989

[51] Int. Cl.$^5$ .............................................. G06F 11/00
[52] U.S. Cl. ..................................................... 371/2.2
[58] Field of Search ......................................... 371/2.2

[56] References Cited

U.S. PATENT DOCUMENTS

| | | | |
|---|---|---|---|
| 3,644,902 | 2/1972 | Beausoleil | 371/2.2 |
| 3,781,826 | 12/1973 | Beausoleil | 371/2.2 |
| 4,692,923 | 9/1987 | Poeppelman | 371/2.2 |
| 4,782,488 | 11/1988 | Anderson | 371/27 |
| 4,811,299 | 3/1989 | Miyazawa et al. | 365/201 |
| 4,918,692 | 4/1990 | Hidaka et al. | 371/2.2 |

FOREIGN PATENT DOCUMENTS 0131832 10/1979 Japan ....................................... 371/2.2

OTHER PUBLICATIONS

Beausoleil, IBM Technical Disclosure Bulletin, vol. 11, No. 12 pp. 1692–1693, May 1969.
Singh et al., IBM Technical Disclosure Bulletin, vol. 26, No. 6 pp. 2747–2748, Nov. 1983.

Primary Examiner—Jerry Smith
Assistant Examiner—Henry C. Lebowitz
Attorney, Agent, or Firm—Faith F. Driscoll; John S. Solakian

[57] ABSTRACT

A memory system containing groups of random access memory (RAM) devices further includes apparatus for distributing input memory addresses so diffused so as to cause the selection of different relative physical cell locations within each RAM device being accessed to provide a single word of information.

24 Claims, 3 Drawing Sheets

METHOD OF ORGANIZING A MEMORY FOR FAULT TOLERANCE

BACKGROUND OF THE INVENTION

1. Field of Use

The present invention relates to memories and more particularly to methods for improving the reliability of dynamic random access memories without requiring extensive testing.

2. Prior Art

It is well known to utilize error detection and correction (EDAC) schemes to make a memory system more reliable. In a typical scheme, the data bits of a word are supplemented by a plurality of check bits called EDAC bits. During each memory cycle of operation, the word is checked for errors and is corrected for single bit errors. The address of the location detected as having produced a single bit error may be flagged for maintenance purposes. Two bit errors and some other multiple bit errors are typically detected but not corrected. Thus, such schemes may not be effective in detecting and correcting multibit errors within a word.

In memory board construction, it is common practice to connect the plurality of memory devices such that like address weight bits are connected to the same respective input pin on each device. That is to say, if a given address bit is connected to address input pin n of the first of the plurality of memory devices, it is connected to address input pin n on the remainder of said devices. Exceptions to this rule are for purposes of efficiency and convenience of board layout and etch routing.

It is also a well known technique to utilize test patterns for testing static and dynamic random access memories (SRAMs and DRAMs, respectively) for detecting faults to ensure memory reliability. Some have used arrangements which include pseudo random pattern generators as address generators. However, it has been found that neither test patterns nor such pseudo random arrangements are able to detect all pattern sensitive faults. For the purpose of the present invention, pattern sensitivity refers to the undesirable relationship between different cells within an integrated circuit (IC) memory part.

The likelihood of a particular cell being "disturbed" is determined by the parts physical and electrical characteristics. Generic testing for pattern sensitive faults requires the use of special tests which involve an exceedingly large number of patterns. The time of such testing increases exponentially with memory size.

Testing time has become a concern since the introduction of large semiconductor memory devices, such as for example, 64K DRAM devices. As RAM devices increase in density and size, the cost of applying exhaustive pattern sensitivity tests becomes increasingly prohibitive. The larger the memory device, the less practical it becomes to fully test such part. That is, RAM devices with such large storage capacities require extended time periods for testing. To reduce the testing burden, some RAM devices have been designed to include built in test circuits enabling several different memory locations to be written with the same data. This type of arrangement is described in U.S. Pat. No. 4,811,299. While this can reduce the time for performing certain test operations, it still does not eliminate the need for the type of exhaustive testing required for detecting pattern sensitive faults.

It has been noted that there is a likelihood of pattern sensitivity similarities between memory parts having similar layouts and those manufactured as part of one or more groups or lots. Because of the importance of detecting such faults, it has been necessary to include circuits in memory testers for reconnecting address paths to those memory parts in which the internal addressing has been altered with respect to some norm which may be arbitrary (i.e., different layouts) to meet certain test development expectations for testing memory parts for pattern sensitivity. An example of one such circuit is disclosed in U.S. Pat. No. 4,782,488.

While the above schemes reduce the need for certain types of testing, a significant level of testing is still required for maintaining a high level of reliability. As RAM parts increase in size, the level of testing continues to increase.

While the prior art acknowledges the existence of pattern sensitivity problems, there has been no direct approach taken to lessen the impact of multiple errors occurring because of pattern sensitivity similarities amongst a group of RAM devices. The above discussed methods of detecting and logging errors only indirectly respond to the problem. Exhaustive testing of memory parts has been used only in the case of moderately dense memory parts because of time and cost considerations.

Accordingly, it is a primary object of the present invention to provide a memory system which does not require extensive testing for establishing reliability.

It is a further object of the present invention to provide a memory system which is tolerant of pattern sensitivities.

SUMMARY OF THE INVENTION

The above and other objects of the present invention are achieved in a preferred embodiment of a memory system organized to include memory addressing apparatus for distributing memory addresses so diffused as to cause the selection of different relative physical cell locations within the different memory integrated circuit (IC) memory chips or parts which comprise a group of bits within the memory system being accessed during each memory cycle of operation. Normally, the group of bits correspond to a word.

The memory addressing apparatus is designed to apply a different address to each simultaneous active IC memory part. In the preferred embodiment, the different addresses are provided by distributing some of the address bits in complementary pairs (i.e., assertions and negations of the memory address applied to the group). Means are provided for connecting each IC memory chip of a group of IC chips which corresponds to a word to receive a unique combination of address bits. This ensures that different physical addresses derived from the single input address applied to the group are applied to each IC chip. Thus, each IC chip is made to respond to different address stimuli, so that IC chips subject to pattern sensitive faults are unlikely to cause multiple errors (the various bits of the word having been obtained from different addressed bit locations).

That is, the arrangement of the present invention increases the memory tolerance toward pattern sensitivity faults particularly where the memory is constructed from IC memory chips from the same manufacturer's lot in which case it is likely that the chips tend to exhibit similar pattern sensitivity relationships or characteristics. By altering the address signal patterns applied to such chips, a pattern sensitivity induced fault occurring in one chip is unlikely to be part of a multiple error in a word consisting of addressed bit cells in different physical locations of a group of IC memory chips.

The apparatus of the present invention can be incorporated into existing memory designs with no increase in logic circuits. Where it is desirable to provide for testing requiring the use of common addresses, means are includable in the system which can be enabled so as to apply the same addresses to each memory IC chip to carry out such testing. An example of such use would be where a specific (as opposed to generic) pattern sensitivity test is applied to a memory array containing a plurality of RAM IC chips having a known pattern sensitivity susceptibility.

Additionally, the memory addressing apparatus of the present invention makes the results obtained from memory monitoring or logging more useful in that it is easier to examine and easier to associate errors with the faulty memory IC part. Additionally, the invention decreases the need to perform extensive memory pattern testing for pattern sensitive faults.

The above objects and advantages of the present invention will be better understood from the following description when taken in connection with the accompanying drawings.

DESCRIPTION OF THE PREFERRED EMBODIMENT

Figure 1:
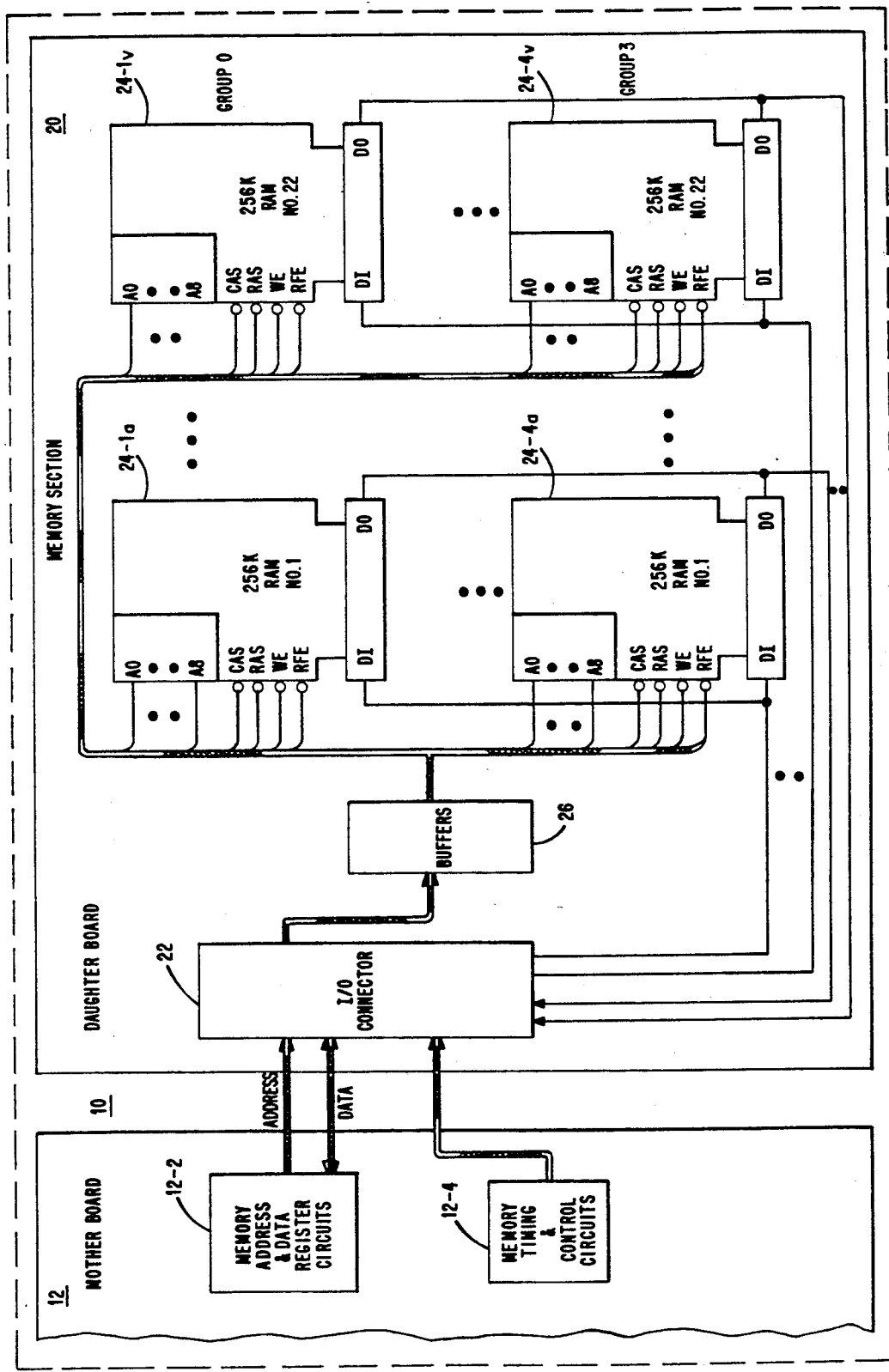
FIG. 1 is a block diagram of a memory system constructed according to the present invention.

With reference to FIG. 1, the organization of a memory system 10 which incorporates the principles of the present invention will now be described. As seen from FIG. 1, memory system 10 includes a mother board 12 and a pair of pluggable memory module daughter boards 20, only one of which is shown. Each daughter board 20 connects to mother board 12 via an I/O connector 22. Board 12 includes all of the memory control logic circuits such as the memory address and data register circuits of block 12-2 and memory timing and control circuits of block 12-4.

The address register circuits 12-2 normally include a number of D-type tristate address registers, each of which receive and store different portions of a 23-bit memory request address from the system bus to which board 12 connects. More specifically, a first register receives and stores a row address portion of the address and a second register receives and stores the column address portion of the address.

The outputs of both row and column address registers are connected in common to provide a single set of address inputs representing the physical word location within the daughter board memory to be accessed. The address inputs are applied via I/O connector 22 to the address input pins of daughter board 20. The address signals and some other signals are repeated by buffers 26 on the daughter board because of loading restrictions. That is to say, the address inputs from the mother board 12 are connected directly to buffers 26 via the I/O connector 22. The outputs of buffers 26 are connected directly to memory devices 24.

The daughter board 20 provides 1,024K words of memory storage organized as four groups of 256K words, for a total of 1,024K words. Each word includes 16 data bits and six EDAC check bits. As seen from FIG. 1, the daughter board 20 contains four groups of 256K bit dynamic RAM chips. These chips are conventional in design and may take the form of the 262,144 word by 1 bit chip manufactured by Intel Corporation.

All of the 256K ×1 bit DRAM chip parts of each group receive the row and column address signals distributed according to the teachings of the present invention during different time intervals as explained herein. Also, all of the DRAM chips receive signals applied to their column address strobe (CAS), row address strobe (RAS), write enable (WE), and refresh enable (RFE) inputs as indicated.

The RAS signal is normally combined with a different decode row address signal derived from decoding high order system memory address bits which determine which of the four groups of memory devices will be accessed. The signals applied to the CAS, RAS, WE, and RFE inputs are generated by the memory mode control and timing circuits of block 12-4 of mother board 12 and repeated by buffers 26 on daughter board 20.

Additionally, the 16 data bits and six EDAC check bits of each data word to be written into memory during each write cycle of operation are applied via I/O connector 22 to the data in (D1) inputs of the memory chips of each row. The 16 data bits and six EDAC check bits of each data word to be read out from memory during each read cycle of operation are applied by the data out (DO) pins of the memory chips of each row to I/O connector 22 for transfer to the system bus. For further information regarding examples of the type of circuits which may be included in FIG. 1, reference may be made to U.S. Pat. No. 4,545,010 issued Oct. 1, 1985.

As previously mentioned, the sets of row and column address signals applied to address pins A0–A8 of each DRAM chip, heretofore have been distributed along a common conductor path with each DRAM chip of each row being connected to receive the same group of address signals. The present invention recognizes that while desirable from a layout viewpoint, such organizations are susceptible to and have less fault tolerance toward multiple pattern sensitive faults. More specifically, it has been observed that multiple errors can occur within a word due to the memory's pattern sensitivity characteristics. This can be due to the presence of a specific data pattern in a set of physically adjacent cells (called "neighbors") or due to a specific undesirable operation of one or more cells in the neighborhood.

The problem of pattern sensitivity can be reduced and its detection greatly enhanced by altering the distribution of chip addresses according to the present invention. This prevents chips manufactured with the same layout and thus expected to have similar "pattern sensitivity" or "disturb" characteristics (e.g., chips within the same lots having more uniformity in such characteristics) from being affected in the same way or disturbed because of having been made to respond to the same address stimulus. The distribution arrangement of the present invention utilizes the fact that a different cell within each chip of a group of chips can be accessed at the same time to collectively provide a word of information without adversely affecting memory operation.

Figure 2:
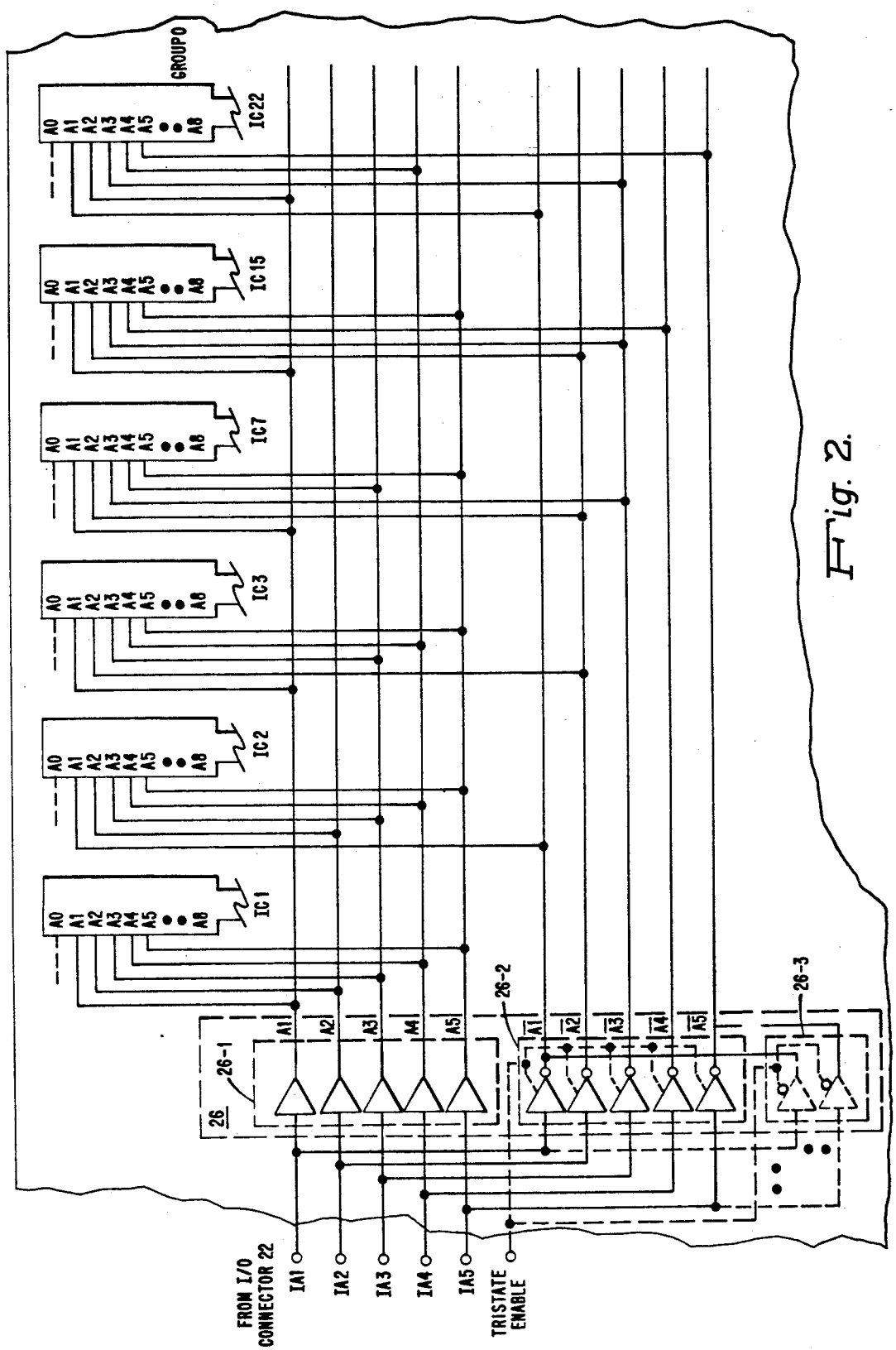
FIG. 2 shows in greater detail, an arrangement for distributing memory addresses according to the present invention.

FIG. 2 shows a section of daughter board 20 of FIG. 1 designed to include the address distribution arrangement of the present invention for diffusing chip input memory addresses to the chips within all four groups of the 256K DRAM chips. As shown, the distribution arrangement utilizes both the assertions and negations of a number of the set of input address signals. That is, as shown in FIG. 2, the address signals IA1-IA5 are applied to both the non-inverting and inverting buffer circuits of blocks 26-1, 26-2 and 26-3. The output address signals A1 through A5 and $\overline{A1}$ through $\overline{A5}$ are combined together so as to apply a different combination of these signals to each of the DRAM chips 24-1A through 24-1V of group 0. These same set of combination of signals are also applied to each group of DRAM chips labeled group 1 through 3. That is, the addresses applied to the 22 DRAM chips of row 0 are as follows:

| DRAM 24-1A | A1, A2, A3, A4, A5 |
| DRAM 24-1B | $\overline{A1}$, A2, A3, A4, A5 |
| DRAM 24-1C | A1, $\overline{A2}$, A3, A4, A5. |
| DRAM 24-1G | A1, $\overline{A2}$, $\overline{A3}$, A4, A5 |
| DRAM 24-1O | A1, $\overline{A2}$, $\overline{A3}$, $\overline{A4}$, A5 |
| DRAM 24-1V | $\overline{A1}$, A2, $\overline{A3}$, A4, $\overline{A5}$. |

DRAMs 24-2A through 24-2V receive the same addresses as DRAMs 24-1A through 24-1V. The same is true for group 3 and group 4 as seen from FIG. 2. The remaining input address signals A0, A6 through A8 are applied in a conventional manner.

The tristate buffers of block 26-3 provide an optional means of causing the address output lines connected to block 26-2 to be driven with signals of the same polarity (i.e., equal to) those of the respective lines of block 26-1. This means allows reverting to non-diffused addressing (i.e., each IC receives the same address) to facilitate testing for particular pattern sensitivities.

The diffused pattern of distributing addresses is carried out simply by adding etch to the memory printed circuit board. There is little complexity introduced with the addition of the diffused addressing patterns. Such complexity is additionally minimized by having to use only a portion of the entire input address to generate the unique combinations. Such complexity may be even further reduced by using an even smaller portion of the address to generate unique combinations to a sub-group of physically co-located IC's.

Figure 3A:
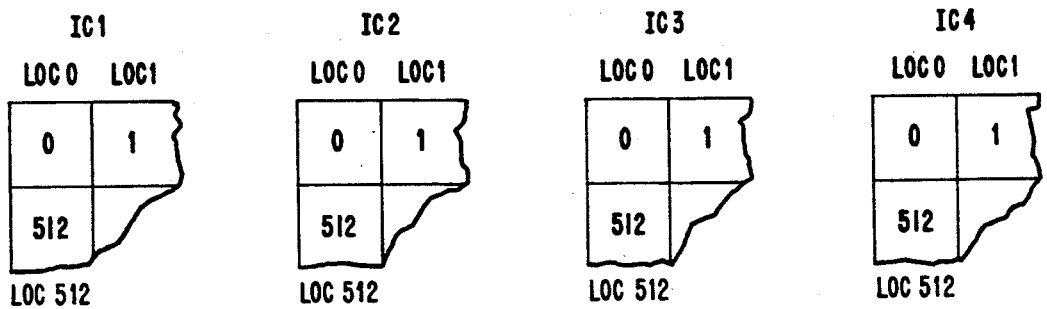
FIGS. 3a and 3b are examples used in explaining the operation of the memory arrangement of FIG. 2.
Figure 3B:
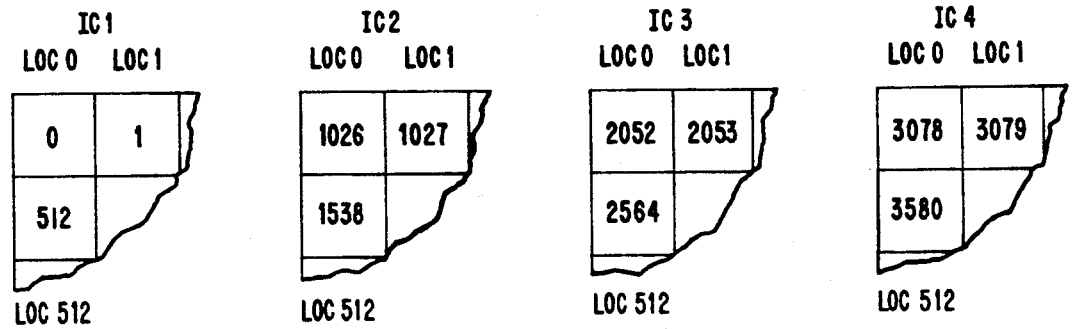

FIGS. 3a and 3b illustrate in diagrammatic form, how the arrangement of the present invention improves fault tolerance to pattern sensitivity induced multiple faults. The binary value of the address portion applied to each chip differs from the binary addresses applied to all other chips of the same word. Obviously, the diffusion pattern can be modified or altered to provide different increments or differences by means of address bit selection and etch changes. As explained herein, other pattern changes may also be made without departing from the teachings of the present invention.

FIG. 3a represents the result of straightforward addressing (i.e., all are memory devices in a group receive identical input addresses) of a group of memory devices internally constructed such that consecutively addressed cells occur starting at an arbitrarily assigned upper left corner of the memory cell array and progressing from left to right and down as words on a page as mentioned previously. The locations of the cells can be viewed as relative physical locations, each having a distinct physical address. The address applied to the group of IC devices comprising a given word can be termed a logical address. FIG. 3a demonstrates the relationship of physical and logical addresses for the first four memory devices of the word IC1-IC4. It can be seen that the relationship is always the same. A given logical address applied to the group of memory devices results in selection of the same physical address in each memory device.

In FIG. 3b, the result of applying the diffused addressing scheme of FIG. 2 is represented. Only in the case of device IC1 do the physical and logical addresses match. In device IC2, the cell at physical address ZERO is addressed by selecting memory group address 1026. That is, since the 2' weight address bit of the device is connected to $\overline{A1}$ rather than A1 (as it is for device IC1), all ZEROS will be present at the address inputs of the device when the memory group address is all ZEROS for A0 and A2 through A8 and a "ONE" for A1. Since A1 is used for both row and column addressing, the memory group addresses would be binary 0000000010000000010, or decimal 1026. The other physical to logical address relationships for the other IC devices similarly derived are as shown.

Different memory device layouts may result in other physical/logical address relationships, but for the assumed layout and with the diffusion method shown in FIG. 3b, it can be appreciated that a common disturbance problem between the same relative physical cells on each of the devices will affect only one such device at a time. This is in contrast to FIG. 3a, where the same type of common disturbance problem will affect all of the devices at a high probability of multiple errors occurring within a single word.

Because the addresses are diffused, during operation a different relative physical cell within each DRAM chip of a selected group of chips will be accessed simultaneously. Addressing each chip at a different relative physical cell reduces the possibility that multiple errors or faults will occur within a word of data being read out as a consequence of pattern sensitivity. Because of the application of different address stimuli to each chip causing different relative physical cells to be simultaneously accessed, it is increasingly unlikely that cells of multiple chips of the group will cause a neighboring cell within such chip to change state so as to produce an error within the same word. Accordingly, there is less likelihood of the occurrence of a multiple error within a word.

Because of the above, the invention makes it easier to locate deteriorating parts, since single bit errors now can be more easily related to a single memory chip due to the decreased likelihood of multiple errors within words. Therefore, testing for deteriorating memory parts is enhanced. For example, the occurrence of single bit errors could be used to trigger special logic circuits which could record such occurrences along with the uncorrected data word and the correction bits in different fields or locations. Hence, the recorded information for many errors could be examined automatically for determining the faulty chips associated with the errors recorded. Thus, the arrangement of the invention facilitates such process.

As to factory or field testing, certain test mode circuits are included as part of block 26 of FIG. 1 which would enable unmodified or non-diffused address signals to be applied to each group of chips within the memory. This is accomplished by providing a separate group of address signals which is applied by another group of tristate driver circuits included in block 26-3 in FIG. 2. The circuits are wire ORed together and activated when the board is being tested. At that time, the tristate enable signal is forced to a different state by the memory control circuits of block 12-4. At the same time, the tristate inverter circuits of block 26-2 are disabled. Numerous other means are available to implement such characteristic, including replacing an IC chip device containing inverting address drivers with one of non-inverting drivers when a socket is used, or by "piggybacking" one enabled IC device over another device disabled through some predetermined means.

DESCRIPTION OF OPERATION

With reference to FIGS. 3a and 3b, the operation of a memory board incorporating the address diffusion arrangement of FIG. 2 will now be described. During each memory cycle of operation, mother board 12 of FIG. 1, in response to a system memory request, as for example, a read request, loads different portions of the memory address into the address registers of block 12-2. In the present example, it will be first assumed that the input memory system address applied to the memory has an all ZERO value.

The high order memory address bits are decoded in a conventional manner which results in the generation of a row decode signal specifying the access of a word within the DRAM chips of row 0. This signal is combined with the RAS signal to produce the enabling signal applied to the RAS inputs of the row 0 chips. The RAS signal also causes the ROW address register to apply the all ZERO row address to I/O connector 22. For purposes of this description, it will be assumed that each IC device is designed such that all cells of the device exist in a single plane 512×512 cell array with the cell addressed by all zeros corresponding to an arbitrarily designated upper left hand corner and the cell addressed by all ones located at the corner diagonally opposite, with each address increment in between progressing across to the right, then down, as words on a page.

The all ZERO address value for bits IA0–IA8 received from I/O connector 22 are applied to the circuits of blocks 26-1 and 26-2 in FIG. 2. This results in different addresses having binary values 00000 through 10101 to be applied to the address inputs A1 through A5 of FIG. 2. It will be noted that the driver circuits for address bits A0, A6, A7 and A8 have been omitted. It will be assumed that non-inverting drivers are used for these bits. During the first half of the access cycle, the entire row address including the diffused address portion corresponding to the signals applied to inputs A1 through A5 and the non-diffused signals applied to inputs A0 and A6 through A8 are strobed into the chips of group 0 in response to the RAS signal. This causes a plurality of locations of a row within each 256 K chip (i.e., each chip is organized into a matrix of rows and columns of storage cells) to be applied to a corresponding plurality of sense amplifier circuits.

During the second half of the same access cycle, one of the plurality of sense amplifier circuits is read out to the chip's data output terminal. The application of the RAS signal is followed by the CAS signal. This signal causes the column address register to apply the all ZERO column address to I/O connector 22. The all ZERO address value for bits IA1–IA5 are applied to the circuits of blocks 26 and 28. The resulting diffused address values 00000 through 10101 are applied to inputs A1 through A5. In response to the CAS signal, the 9-bit diffused column addresses are latched into column buffer circuits internal to each IC chip of group 0.

The result is that, during the read cycle, a different bit location specified by the diffused row and column addresses within the 256K bit locations of each chip within group 0 is accessed. Its content is then applied to the D0 terminal of each chip. The resulting 22-bit word consisting of 16 data and six EDAC check bits is then forwarded to the system bus via I/O connector 22. It is seen that for a system address of all ZEROS, the row and column addresses have the following values:

|     | Column     | Row        |
|     | A8   A0    | A8   A0    |
| --- | ---------- | ---------- |
| IC1 | 000000000  | 000000000  |
| IC2 | 000000010  | 000000010  |
| IC3 | 000000100  | 000000100  |
| IC4 | 000000110  | 000000110  |

When a group address of "0000000000000000010" is applied, the row and column addresses have the following values:

|     | Column     | Row        |
|     | A8   A0    | A8   A0    |
| --- | ---------- | ---------- |
| IC1 | 000000000  | 000000010  |
| IC2 | 000000010  | 000000000  |
| IC3 | 000000100  | 000000110  |
| IC4 | 000000110  | 000000100. |

When the appropriate binary weights are assigned to these addresses, the bit locations shown in FIG. 3a are accessed which result in the read of 22-bit words in response to the indicated system addresses. It is seen that if there was a pattern sensitivity fault in which the same relative neighboring cells in the group of IC's was affected, such a fault would not produce a multiple error in the word being read out due to the address separation achieved by the apparatus of the present invention. This is in contrast to the normal address arrangement illustrated in FIG. 3a. Here, a pattern sensitivity induced fault could produce as many as 22 errors in a single word.

In practice, based on memory part characteristics, a desired address separation pattern can be established for the different memory locations of the memory. That is to say, the layouts of the particular RAM devices to be used in manufacture of the board, board electrical design requirements, and board layout requirements, can all be taken into consideration in determining one or more optimum address diffusion arrangements from among the various possibilities, one of which has been detailed above.

Figure 4:
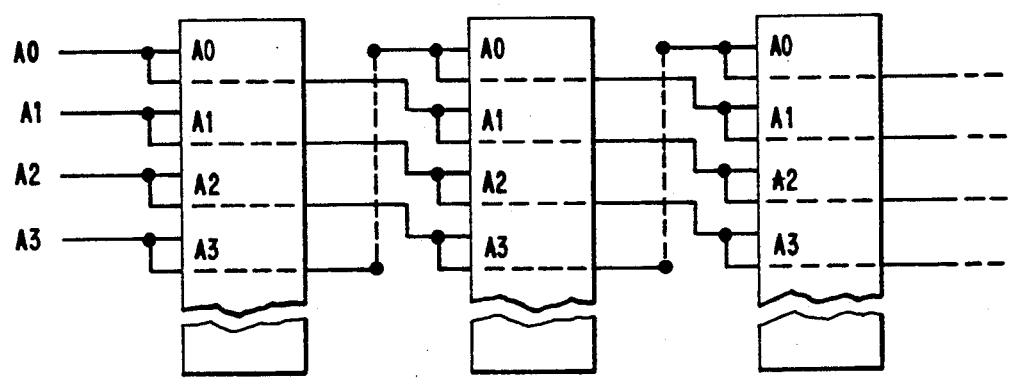
FIG. 4 shows an alternate arrangement for applying principles of the present invention.

In cases where the generation of separate address assertions and negations may be impractical, an alternate arrangement utilizing etch variations may be used. FIG. 4 provides a conceptual example of illustrating how a form of diffusion may be accomplished by the use of special routing of interconnecting etch in lieu of assertions and negations. The conductive wires that apply address bits A0–A3 are scrambled so that only in a minimum number of instances, are two memory devices driven with the same address. It will be appreciated that FIG. 4 is not intended to illustrate a method of achieving maximum diffusion for a particular case, but rather shows that diffusion may be achieved by means other than inverting and non-inverting drivers. The optimum arrangement for a given memory is a function of the number of address lines and word size. Even when the optimum etch-varying arrangement for a particular case is used, a different address at each memory device cannot be achieved when the input address has an all ZERO or all ONE value. Further, it will be appreciated that for similar practical considerations, it may be desirable to combine the use of assertions and negations with etch-varying arrangements.

From the above, it is seen how the arrangement of the present invention enhances memory fault tolerance through address diffusion making such memory less susceptible to pattern sensitivity faults.

It will be appreciated by those skilled in the art that the principles described as being applied to a board comprised of a plurality of single data bit IC's can also be applied to a board comprised of a plurality of multiple data bit IC's, or an IC device composed of a plurality of distinct arrays. Therefore, the term "chip" is not to be interpreted in a limited fashion and can take many different forms depending upon the particular technology to which the principles of the invention are applied.

While in accordance with the provisions and statutes there has been illustrated and described the best form of the invention, certain changes may be made without departing from the spirit of the invention as set forth in the appended claims and that in some cases, certain features of the invention may be used to advantage without a corresponding use of other features.

What is claimed is:

1. A method of constructing a memory system board for reducing the occurrence of multiple errors produced from pattern sensitivity induced faults within said memory system which includes a plurality of semiconductor chips, each having a plurality of addressable cells, said plurality of chips being organized into a number of groups x containing xn number of chips so as to provide access to a plurality of words, each word having n number of bits, said method comprising the steps of:
   (a) selecting in the design of said memory system board unique sets of address signals from the possible combinations of addresses derivable from a system input address to be applied to said memory system board for application to the input pins of said n number of chips within each group; and
   (b) applying to said memory chips within each group, during the design of said memory system board different combinations of the assertions and negations of selected bits of said input address representative of one of said unique sets of said address signals which remain constant for increasing said chip's tolerance to said pattern sensitivity faults for simultaneously addressing a different bit location within each chip of said number of chips of said each group to read out or write into said memory system, said n number of bits of said word in parallel therefrom.

2. The method of claim 1 wherein said system input address includes a row address portion and a column address portion and wherein said step (a) further includes selecting unique combinations of a umber of bits for each said row and column address portion for application to a first number of said input pins and wherein step (b) further includes applying to said memory chips of each group said row and column address portions during successive cycles of operation.

3. The method of claim 2 wherein the number of unique combinations selected to be greater than the minimum number needed to provide a different address at each simultaneously active memory chip so as to reduce board interconnection complexity.

4. The method of claim 1 wherein x has a value greater than one and the same unique set of address signals are applied to said chips of each group of chips.

5. The method of claim 1 wherein step (a) includes a step of selecting said address combinations so that when a cell in any memory chip being accessed to provide said word is addressed, the corresponding neighboring cell in any of the remaining memory chips being simultaneously accessed to provide said word is not accessed to provide a bit portion of said word.

6. The method of claim 5 wherein said selection of said address combinations are made to provide desired separation between cells relative to interconnections required in physically distributing said different combinations of chip addresses.

7. The method of constructing a memory system for increasing tolerance to pattern sensitivity induced faults, said memory system including a plurality of semiconductor chips, each having a plurality of addressable cells, said chips being organized into a plurality of groups wherein each group contains n number of chips so as to provide access to a plurality of words, each word having n number of bits, said method comprising the steps of:
   (a) generating a number of additional address bit signals from system input address bits required for increasing tolerance of said chips to pattern sensitive faults for applying unique sets of address signals to the input pins of said n number of chips within each group; and,
   (b) applying to each of said memory chips within each group, during the design of said memory system a different address combination which remains constant, said combination utilizing one or more of said additional address bit signals except for no more than one of said chips of each group, for simultaneously addressing a different bit location within each chip of said number of chips of said each group to read or write said n number of bits of said word in parallel from said memory system.

8. The method of claim 7 wherein said step (a) includes the step of generating inversions of a predetermined number of said system input address bits by inverting assertions of said predetermined number of said system input address bits and in step (b) applying to said memory chips within each group, different combinations of the assertions and negations of said system input address bits for addressing a different bit location within each chip of said number of chips of said each group.

9. The method of claim 8 wherein step (b) includes a step of selecting said address combinations so that when a cell in any memory chip being accessed to provide said word is addressed, the corresponding neighboring cell in any of the remaining memory chips being simultaneously accessed to provide said word is not accessed to provide a bit portion of said word.

10. The method of claim 9 wherein said selection of said address combinations are made to provide desired separation between cells relative to interconnections required in physically distributing said different combinations of chip addresses.

11. The method of claim 7 wherein said step (a) includes the step of generating said number of additional address bit signals by routing interconnecting etch so that different combinations of the input pins of each chip connect to the address bits of said system input address bits and wherein in step (b) different address combinations are applied to each of said memory chips within each group for minimizing the number of instances where more than one memory chip is driven with the same address.

12. The method of claim 11 wherein in an optimum arrangement, said more than one memory chip is driven with said same address only in response to said system input address having either all ONES or all ZEROS value.

13. The method of claim 7 wherein said system input address includes a row address portion and a column address portion and wherein said step (a) further includes selecting unique combinations of a number of bits for each said row and column address portion for application to a first number of said input pins and wherein step (b) further includes applying to said memory chips of each group said row and column address portions during successive cycles of operation.

14. The method of claim 7 wherein the same unique set of address signals are applied to said chips of each group of chips.

15. The method of claim 14 wherein the number of unique combinations selected to be greater than the minimum number needed to provide a different address at each simultaneously active memory chip so as to minimize board interconnection complexity.

16. A fault tolerant memory module board for use in a system comprising at least said one memory module board connected to a memory control board which receives a system input address representing a particular storage location within said memory module board and generates signals for causing information to be written into or read from said storage location, said memory module board comprising:
 a plurality of addressable random access memory (RAM) chips, each RAM chip having a plurality of input address pins, said chips being organized into a plurality of groups, each group containing x number of chips so as to provide access to a plurality of words, each word having n number of bits;
 address generating means connected to receive said system input address and for generating an additional number of address bit signals required for increasing tolerance of said chips to pattern sensitive faults for applying unique sets of address signals to said input pins of said x number of chips within each group; and
 means connected to said address generating means for applying to each of said memory chips within each group, a different address combination which remains constant, as part of the design of said memory module board said combination containing one or more of said additional address bit signals except for one of said chips of each group, for simultaneously addressing a different bit location within each chip of said x number of chips of said each group in response to each different system input address to read out or write into said memory module board said n number of bits of said words in parallel therefrom.

17. The memory module board of claim 16 wherein said address generation means includes a plurality of inverter circuits corresponding in number to the number of bits required for generating all of said additional combinations.

18. The memory module board of claim 17 wherein each RAM chip has a storage capacity which is sufficiently large making pattern sensitivity testing impractical.

19. The memory module board of claim 17 wherein said system input address includes row and column address portions and wherein said means for applying includes first conductor means for applying in succession, each said row and column address portion to said input pins of said RAM chips of each group and said board further including second conductor means for applying row and column address strobe signals to said RAM chips for storing said row and column portions in said RAM chips during successive cycles of operation.

20. The memory board of claim 17 wherein said number of unique combinations selected to be greater than the minimum number needed to provide a different address at each simultaneously active memory chip so as to minimize board interconnection complexity.

21. The memory board of claim 17 wherein said means for applying applies address combinations selected so that when a cell in each memory chip is addressed the corresponding neighboring cell in any of the remaining memory chips being simultaneously accessed to provide said word is not accessed to provide a bit portion of said word.

22. The memory board of claim 21 wherein said selection of said address combinations are made to provide desired separation between cells relative to interconnections required in physically distributing said different combinations of chip addresses.

23. The memory board of claim 17 wherein said address generation means includes circuit means connected to inhibit said generation of additional addresses so as to apply the same combination of addresses to said RAM chips of each group.

24. The memory board of claim 23 wherein said circuit means includes tristate circuit driver circuits connected to be enabled in response to a signal from said control board to pass said number of address bits without inversion for application to said RMA chips of said groups.

* * * * *